(12) United States Patent
Malhotra et al.

(10) Patent No.: US 8,574,998 B2
(45) Date of Patent: Nov. 5, 2013

(54) LEAKAGE REDUCTION IN DRAM MIM CAPACITORS

(75) Inventors: Sandra Malhotra, San Jose, CA (US); Kenichi Koyanagi, Higashihiroshima (JP); Hiroyuki Ode, Higashihiroshima (JP); Xiangxin Rui, Campbell, CA (US); Takashi Arao, Higashihiroshima (JP); Naonori Fujiwara, Kure (JP)

(73) Assignees: Intermolecular, Inc., San Jose, CA (US); Elpida Memory, Inc., Tokyo (JP)

( * ) Notice: Subject to any disclaimer, the term of this patent is extended or adjusted under 35 U.S.C. 154(b) by 108 days.

(21) Appl. No.: 13/311,368

(22) Filed: Dec. 5, 2011

(65) Prior Publication Data
US 2013/0143379 A1    Jun. 6, 2013

(51) Int. Cl.
*H01L 21/02*        (2006.01)
(52) U.S. Cl.
USPC .................................. 438/396; 257/E21.011

(58) Field of Classification Search
USPC .................................. 438/396; 257/E21.011
See application file for complete search history.

(56) References Cited

U.S. PATENT DOCUMENTS 8,357,583 B2 *  1/2013  Hirota et al. ................ 438/381

* cited by examiner

*Primary Examiner* — William D Coleman (57) ABSTRACT

A method for reducing the leakage current in DRAM MIM capacitors comprises forming a multi-layer dielectric stack from an amorphous highly doped material, an amorphous high band gap material, and a lightly or non-doped material. The highly doped material will remain amorphous (<30% crystalline) after an anneal step. The high band gap material will remain amorphous (<30% crystalline) after an anneal step. The lightly or non-doped material will become crystalline (≥30% crystalline) after an anneal step. The high band gap material is formed between the amorphous highly doped material and the lightly or non-doped material and provides an intermediate barrier to conduction through the multi-layer dielectric stack.

15 Claims, 7 Drawing Sheets

LEAKAGE REDUCTION IN DRAM MIM CAPACITORS

This document relates to the subject matter of a joint research agreement between Intermolecular, Inc. and Elpida Memory, Inc.

FIELD OF THE INVENTION

The present invention relates generally to the field of dynamic random access memory (DRAM), and more particularly to methods of forming a capacitor stack for improved DRAM performance.

BACKGROUND OF THE INVENTION

Dynamic Random Access Memory utilizes capacitors to store bits of information within an integrated circuit. A capacitor is formed by placing a dielectric material between two electrodes formed from conductive materials. A capacitor's ability to hold electrical charge (i.e., capacitance) is a function of the surface area of the capacitor plates A, the distance between the capacitor plates d, and the relative dielectric constant or k-value of the dielectric material. The capacitance is given by:

$$C = \kappa\varepsilon_o \frac{A}{d} \quad \text{(Eqn. 1)}$$

where $\varepsilon_o$ represents the vacuum permittivity.

The dielectric constant is a measure of a material's polarizability. Therefore, the higher the dielectric constant of a material, the more electrical charge the capacitor can hold. Therefore, for a given desired capacitance, if the k-value of the dielectric is increased, the area of the capacitor can be decreased to maintain the same cell capacitance. Reducing the size of capacitors within the device is important for the miniaturization of integrated circuits. This allows the packing of millions (mega-bit (Mb)) or billions (giga-bit (Gb)) of memory cells into a single semiconductor device. The goal is to maintain a large cell capacitance (generally ~10 to 25 fF) and a low leakage current (generally $<10^{-7}$ A cm$^{-2}$). The physical thickness of the dielectric layers in DRAM capacitors could not be reduced unlimitedly in order to avoid leakage current caused by tunneling mechanisms which exponentially increase as the thickness of the dielectric layer decreases.

Traditionally, SiO$_2$ has been used as the dielectric material and semiconducting materials (semiconductor-insulator-semiconductor [SIS] cell designs) have been used as the electrodes. The cell capacitance was maintained by increasing the area of the capacitor using very complex capacitor morphologies while also decreasing the thickness of the SiO$_2$ dielectric layer. Increases of the leakage current above the desired specifications have demanded the development of new capacitor geometries, new electrode materials, and new dielectric materials. Cell designs have migrated to metal-insulator-semiconductor (MIS) and now to metal-insulator-metal (MIM) cell designs for higher performance.

Typically, DRAM devices at technology nodes of 80 nm and below use MIM capacitors wherein the electrode materials are metals. These electrode materials generally have higher conductivities than the semiconductor electrode materials, higher work functions, exhibit improved stability over the semiconductor electrode materials, and exhibit reduced depletion effects. The electrode materials must have high conductivity to ensure fast device speeds. Representative examples of electrode materials for MIM capacitors are metals, conductive metal oxides, conductive metal silicides, conductive metal nitrides (i.e. TiN), or combinations thereof. MIM capacitors in these DRAM applications utilize insulating materials having a dielectric constant, or k-value, significantly higher than that of SiO$_2$ (k=3.9). For DRAM capacitors, the goal is to utilize dielectric materials with k values greater than about 40. Such materials are generally classified as high-k materials. Representative examples of high-k materials for MIM capacitors are non-conducting metal oxides, non-conducting metal nitrides, non-conducting metal silicates or combinations thereof. These dielectrics may also include additional dopant materials.

A figure of merit in DRAM technology is the electrical performance of the dielectric material as compared to SiO$_2$ known as the Equivalent Oxide Thickness (EOT). A high-k material's EOT is calculated using a normalized measure of silicon dioxide (SiO$_2$ k=3.9) as a reference, given by:

$$EOT = \frac{3.9}{\kappa} \cdot d \quad \text{(Eqn. 2)}$$

where d represents the physical thickness of the capacitor dielectric.

As DRAM technologies scale below the 40 nm technology node, manufacturers must reduce the EOT of the high-k dielectric films in MIM capacitors in order to increase charge storage capacity. The goal is to utilize dielectric materials that exhibit an EOT of less than about 0.8 nm while maintaining a physical thickness of about 5-20 nm.

One class of high-k dielectric materials possessing the characteristics required for implementation in advanced DRAM capacitors are high-k metal oxide materials. Titanium dioxide (TiO$_2$) and zirconium dioxide (ZrO$_2$) are two metal oxide dielectric materials which display significant promise in terms of serving as high-k dielectric materials for implementation in DRAM capacitors. Other metal oxide high-k dielectric materials that have attracted attention include Al$_2$O$_3$, BaSrTiO$_x$ (BST), HfO$_2$, HfSiO$_x$, Nb$_2$O$_5$, PbZrTiO$_x$ (PZT), a bilayer of SiO$_2$ and Si$_x$N$_y$, SiON, SrTiO$_3$ (STO), Ta$_2$O$_5$, TiO$_2$, ZrO$_2$, etc.

Generally, as the dielectric constant of a material increases, the band gap of the material decreases. This leads to high leakage current in the device. As a result, without the utilization of countervailing measures, capacitor stacks implementing high-k dielectric materials may experience large leakage currents. High work function electrodes (e.g., electrodes having a work function of greater than 5.0 eV) may be utilized in order to counter the effects of implementing a reduced band gap high-k dielectric layer within the DRAM capacitor. Metals, such as platinum, gold, ruthenium, and ruthenium oxide are examples of high work function electrode materials suitable for inhibiting device leakage in a DRAM capacitor having a high-k dielectric layer. The noble metal systems, however, are prohibitively expensive when employed in a mass production context. Moreover, electrodes fabricated from noble metals often suffer from poor manufacturing qualities, such as surface roughness, poor adhesion, and form a contamination risk in the fab.

Leakage current in capacitor dielectric materials can be due to Schottky emission, Frenkel-Poole defects (e.g. oxygen vacancies (V$_{ox}$) or grain boundaries), or Fowler-Nordheim tunneling. Schottky emission, also called thermionic emission, is a common mechanism and is the heat-induced flow of charge over an energy barrier whereby the effective barrier height of a MIM capacitor controls leakage current. The effective barrier height is a function of the difference between the work function of the electrode and the electron affinity of the dielectric. The electron affinity of a dielectric is closely related to the conduction band offset of the dielectric. The Schottky emission behavior of a dielectric layer is generally determined by the properties of the dielectric/electrode interface. Frenkel-Poole emission allows the conduction of charges through a dielectric layer through the interaction with defect sites such as vacancies, grain boundaries, and the like. As such, the Frenkel-Poole emission behavior of a dielectric layer is generally determined by the dielectric layer's bulk properties. Fowler-Nordheim emission allows the conduction of charges through a dielectric layer through tunneling. As such, the Fowler-Nordheim emission behavior of a dielectric layer is generally determined by the physical thickness of the dielectric layer. This leakage current is a primary driving force in the adoption of high-k dielectric materials. The use of high-k materials allows the physical thickness of the dielectric layer to be as thick as possible while maintaining the required capacitance (see Eqn 1 above).

SUMMARY OF THE DISCLOSURE

The following summary of the invention is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

In some embodiments of the present invention, a multi-layer dielectric stack is formed from a highly doped material, a high band gap material, and a lightly or non-doped material. The highly doped material will remain amorphous (<30% crystalline) after an anneal step. The high band gap material will remain amorphous (<30% crystalline) after an anneal step. The lightly or non-doped material will become crystalline (≥30% crystalline) after an anneal step. In some embodiments, the multi-layer dielectric stack is formed from $ZrO_2$. In some embodiments, the lightly or non-doped $ZrO_2$ material is formed above a first electrode layer, the high band gap material is formed above the lightly or non-doped $ZrO_2$ material, and the highly doped $ZrO_2$ material is formed above the high band gap material. In some embodiments, a thin $TiO_2$ layer is formed between the first electrode layer and the lightly or non-doped $ZrO_2$ material. In some embodiments, a thin $TiO_2$ layer is formed between the second electrode layer and the highly doped $ZrO_2$ material.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which.

DETAILED DESCRIPTION

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

Dopants can be added to the dielectric material to increase the k-value and/or decrease the leakage current. As used herein, the dopant may be electrically active or not electrically active. The definition excludes residues and impurities such as carbon, etc. that may be present in the material due to inefficiencies of the process or impurities in the precursor materials. The concentration of the dopant is one factor that affects the crystallinity of the dielectric material. Other factors that affect the crystallinity of the dielectric material comprise annealing time, annealing temperature, film thickness, etc. Generally, as the concentration of the dopant is increased, the crystallization temperature of the dielectric material increases.

Lightly or non-doped dielectric materials wherein the dopant concentration is low will generally be crystalline after being annealed at 550 C for 5 minutes, will exhibit high k-values, but sometimes will also exhibit higher leakage current. As used herein, a dielectric material will be considered to be crystalline if it exhibits greater than or equal to 30% crystallinity as measured by a technique such as x-ray diffraction (XRD) after an anneal step. The higher leakage current is partly due to leakage along the grain boundaries due to the Frenkel-Poole mechanism discussed earlier. Conversely, highly doped dielectric materials wherein the dopant concentration is high will generally be amorphous after being annealed at 550 C for 5 minutes, will exhibit lower k-values, but will also exhibit low leakage current. Typically, dielectric materials that are doped with dopant levels above about 10 to 15 atomic % will remain amorphous after the typical anneal steps used in the fabrication of DRAM devices. However, this will vary depending on the dielectric material, the dopant, and the details of the annealing step and is not intended to be limiting. The properties of these two types of dielectric materials may be combined to concurrently meet the EOT (a function of the k-value) and the leakage current targets for advanced DRAM technologies.

Figure 1:
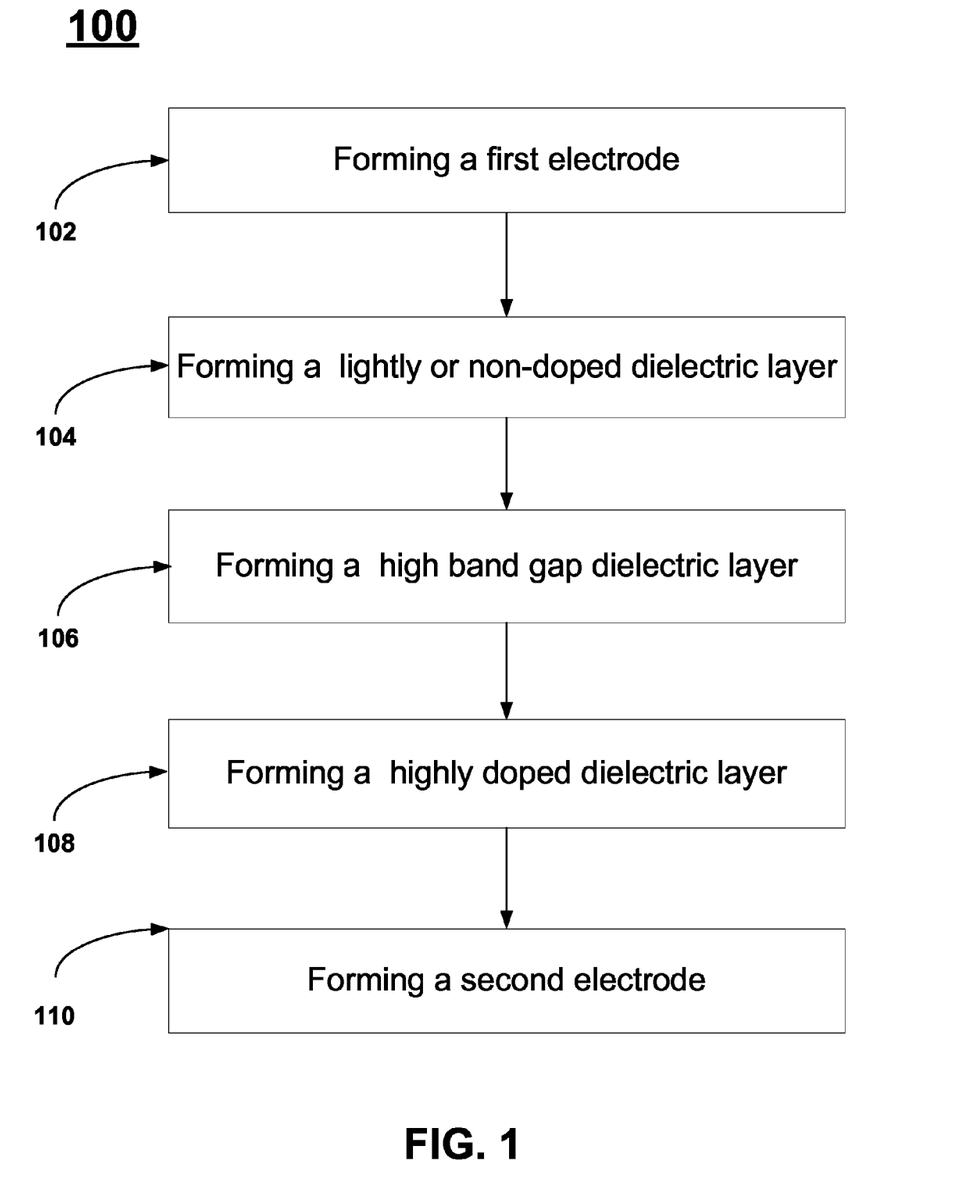
FIG. 1 illustrates a flow chart describing a method for fabricating a DRAM capacitor stack in accordance with some embodiments of the present invention.

FIG. 1 describes a method, 100, for fabricating a DRAM capacitor stack. The initial step, 102, comprises forming a first electrode layer on a substrate. Examples of suitable electrode materials comprise metals, metal alloys, conductive metal oxides, conductive metal silicides, conductive metal nitrides, or combinations thereof. A particularly interesting class of materials is the conductive metal oxides. Optionally, the first electrode layer can then be subjected to an annealing process (not shown). If the first electrode layer is a conductive metal nitride material, then the first electrode layer may be annealed using a Rapid Thermal Anneal (RTA) technique or furnace anneal technique. For the RTA case, the temperature is quickly raised in the presence of a nitrogen containing gas such as $N_2$, forming gas, $NH_3$, etc. Examples of such electrode treatment steps are further described in U.S. application Ser. No. 13/051,531 filed on Mar. 18, 2011, which is incorporated herein by reference. Alternatively, if the first electrode is a conductive metal oxide, then the first electrode layer may be annealed in an inert or reducing atmosphere such as Ar, $N_2$, or forming gas. Examples of such an annealing process is further described in U.S. application Ser. No. 13/084,666 filed on Apr. 12, 2011, entitled "METHOD FOR FABRICATING A DRAM CAPACITOR" and is incorporated herein by reference.

The next step, 104, comprises forming a lightly or non-doped first dielectric material above the first electrode layer. This layer will crystallize during a subsequent anneal treatment and will contribute a high k value to the multi-layer dielectric stack. The next step, 106, comprises forming a high band gap second dielectric material above the first dielectric layer. This layer will remain amorphous during a subsequent anneal treatment because it is thin and will contribute a high barrier to block conduction through the multi-layer dielectric stack. The next step, 108, comprises forming a highly doped third dielectric material above the high band gap second dielectric layer to form a multi-layer dielectric stack. This layer will remain amorphous during a subsequent anneal treatment because it is highly doped and will contribute a high barrier to block conduction through the multi-layer dielectric stack. The crystalline phases of dielectric materials exhibit higher-k values than the amorphous phases. Therefore, there is often an optional anneal step either after the dielectric formation step (also known as a post dielectric anneal (PDA)) or an anneal step after the formation of the second electrode (also known as a post metallization anneal (PMA)) to crystallize at least a portion of the dielectric layer. Examples of the PDA and PMA treatments are further described in U.S. application Ser. No. 13/159,842 filed on Jun. 14, 2011, entitled "METHOD OF PROCESSING MIM CAPACITORS TO REDUCE LEAKAGE CURRENT" and is incorporated herein by reference.

The next step, 110, comprises forming a second electrode layer above the multi-layer dielectric stack to form a capacitor stack. Typically, the capacitor stack can then be subjected to an annealing process (not shown) as mentioned previously.

Those skilled in the art will appreciate that each of the first electrode layer, the first, second, and third dielectric materials, and the second electrode layer used in the DRAM MIM capacitor may be formed using any common formation technique such as atomic layer deposition (ALD), plasma enhanced atomic layer deposition (PE-ALD), atomic vapor deposition (AVD), ultraviolet assisted atomic layer deposition (UV-ALD), chemical vapor deposition (CVD), plasma enhanced chemical vapor deposition (PECVD), or physical vapor deposition (PVD). Generally, because of the complex morphology of the DRAM capacitor structure, ALD, PE-ALD, AVD, or CVD are preferred methods of formation. However, any of these techniques are suitable for forming each of the various layers discussed below. Those skilled in the art will appreciate that the teachings described below are not limited by the technology used for the deposition process.

In FIGS. 2, 3, 5, and 6 below, a capacitor stack is illustrated using a simple planar structure. Those skilled in the art will appreciate that the description and teachings to follow can be readily applied to any simple or complex capacitor morphology. The drawings are for illustrative purposes only and do not limit the application of the present invention.

Figure 2:
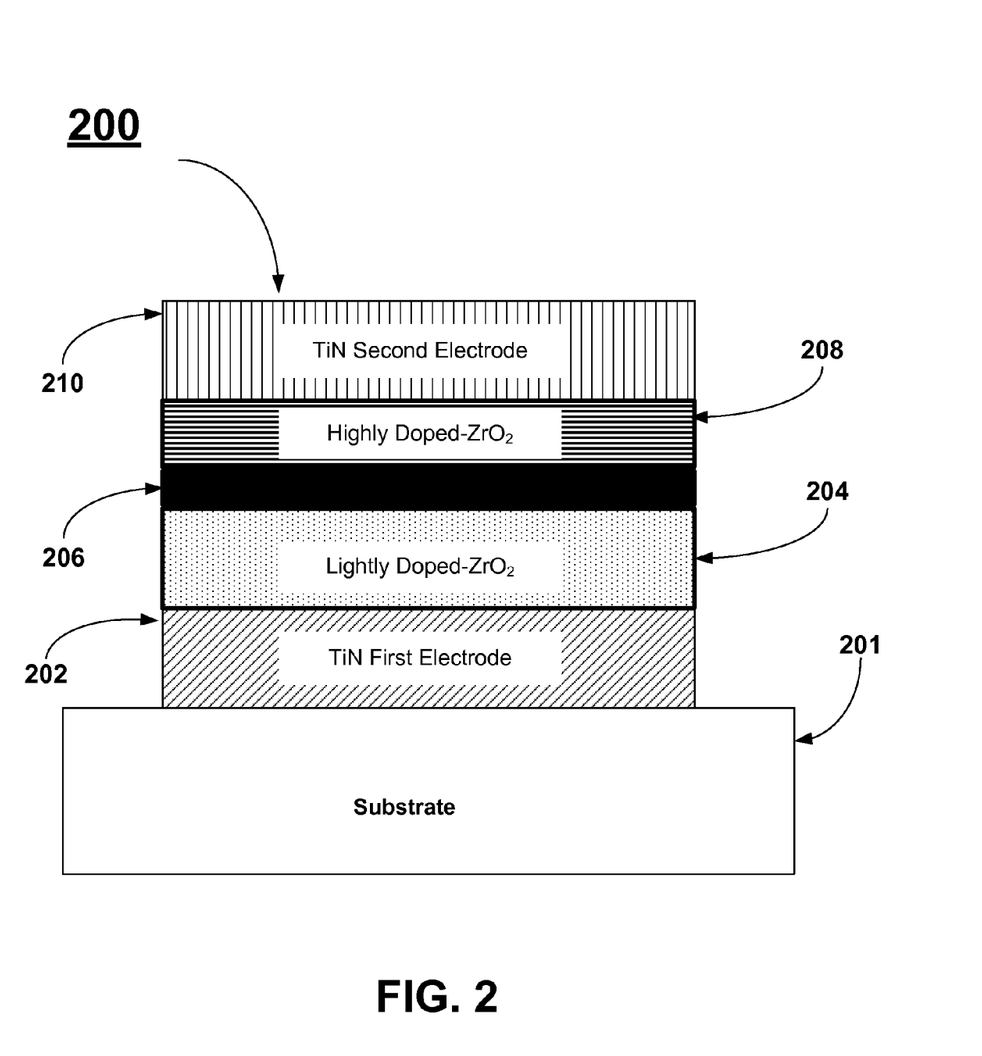
FIG. 2 illustrates a simplified cross-sectional view of a DRAM capacitor stack fabricated in accordance with some embodiments of the present invention.

FIG. 2 illustrates a simplified cross-sectional view of a DRAM capacitor stack fabricated in accordance with some embodiments of the present invention. This example will use $ZrO_2$ as the dielectric material. However, those skilled in the art will understand that the present methods may be applied to many dielectric materials. Examples of suitable dielectric materials comprise $Al_2O_3$, $BaSrTiO_x$ (BST), $HfO_2$, $HfSiO_x$, $Nb_2O_5$, $PbZrTiO_x$ (PZT), $SiO_2$, a bilayer of $SiO_2$ and $Si_xN_y$, SiON, $SrTiO_3$ (STO), $Ta_2O_5$, $TiO_2$, etc.

First electrode layer, 202, is formed above substrate, 201. Generally, the substrate has already received several processing steps in the manufacture of a full DRAM device. First electrode layer, 202, comprises one of metals, metal alloys, conductive metal oxides, conductive metal nitrides, conductive metal silicides, conductive metal carbides, etc. For this example, first electrode layer, 202, comprises a conductive metal nitride. Examples of such conductive metal nitrides include the conductive compounds of cobalt nitride, molybdenum nitride, nickel nitride, tantalum nitride, titanium nitride, titanium aluminum nitride, tungsten nitride, or combinations thereof. A specific electrode material of interest is titanium nitride when $ZrO_2$ is used as the dielectric material. The titanium nitride is typically formed using PVD, PECVD, CVD, or ALD. The TiN first electrode layer may optionally receive an RTA anneal treatment before the formation of the multi-layer dielectric material as discussed previously.

Lightly or non-doped $ZrO_2$ first dielectric material, 204, is then formed above the TiN first electrode layer. Suitable dopants for use with $ZrO_2$ dielectric materials comprise Al, Co, Er, Ga, Gd, Ge, Hf, La, Mg, Si, Sn, Sr, Ti, Y, or combinations thereof. The doping level is maintained at levels below about 15 atomic % and advantageously below about 10 atomic % so that the layer will crystallize during a subsequent anneal step. This layer will crystallize during a subsequent anneal treatment and will contribute a high k value to the multi-layer dielectric stack. The lightly or non-doped $ZrO_2$ first dielectric material is typically formed using ALD, PE-ALD, PECVD, or CVD.

High band gap second dielectric material, 206, is then formed above the lightly doped $ZrO_2$ material. Suitable high band gap second dielectric materials comprise at least one of $Al_2O_3$, $Er_2O_3$, $Gd_2O_3$, $La_2O_3$, or combinations thereof. This layer will remain amorphous during a subsequent anneal treatment because it is thin and will contribute a high barrier to block conduction through the multi-layer dielectric stack. The high band gap second dielectric material is typically formed using ALD, PE-ALD, PECVD, or CVD.

Highly doped $ZrO_2$ third dielectric material, 208, is then formed above the high band gap second dielectric material to form a multi-layer dielectric stack. Suitable dopants for use with $ZrO_2$ dielectric materials comprise Al, Co, Er, Ga, Gd, Ge, Hf, La, Mg, Si, Sn, Sr, Ti, Y, or combinations thereof. The doping level is maintained at levels above about 15 atomic % and advantageously above about 20 atomic % so that the layer will not crystallize during a subsequent anneal step. This layer will contribute a high barrier to block conduction through the multi-layer dielectric stack. The multi-layer dielectric stack may optionally receive a PDA treatment as discussed previously. The highly doped $ZrO_2$ third dielectric material is typically formed using ALD, PE-ALD, PECVD, or CVD.

In this exemplary capacitor stack, the lightly or non-doped dielectric material has been described as being formed above the first electrode layer, the high band gap material has been described as being formed above the lightly or non-doped dielectric material, and the highly doped material has been described as being formed above the high band gap material. Those skilled in the art will understand that the sequence may be altered and still achieve the benefits of the present invention. That is, the sequence may be that the highly doped dielectric material is formed above the first electrode layer, the high band gap material is formed above the highly doped dielectric material, and the lightly or non-doped material is formed above the high band gap material. Both sequences fall within the scope of the present invention.

In this exemplary capacitor stack, the lightly or non-doped dielectric material has been described as being the same material as the highly doped material. Those skilled in the art will understand that the two layers may comprise different materials and still achieve the benefits of the present invention. One of the layers (i.e. the lightly or non-doped dielectric material) primarily contributes to the high k value of the dielectric stack. The other layer (i.e. the highly doped material) primarily contributes to the low leakage of the dielectric stack. Therefore, each layer may be chosen to maximize its contribution to the benefits of the present invention.

Those skilled in the art will understand that the dopant species used in the highly doped material may be the same or may be different from the dopant species used in the lightly or non-doped dielectric material. One of the layers (i.e. the lightly or non-doped dielectric material) primarily contributes to the high k value of the dielectric stack. The other layer (i.e. the highly doped material) primarily contributes to the low leakage of the dielectric stack. Various dopants may contribute to the k value and the leakage current blocking properties of the dielectric materials in different ways. Therefore, the dopant used in each layer may be chosen to maximize its contribution to the benefits of the present invention.

Second electrode layer, 210, is then formed above the multi-layer dielectric stack to form a capacitor stack. Second electrode layer, 210, comprises one of metals, metal alloys, conductive metal oxides, conductive metal nitrides, conductive metal silicides, conductive metal carbides, etc. For this example, second electrode layer, 210, comprises a conductive metal nitride. Examples of such conductive metal nitrides include the conductive compounds of cobalt nitride, molybdenum nitride, nickel nitride, tantalum nitride, titanium nitride, titanium aluminum nitride, tungsten nitride, or combinations thereof. A specific electrode material of interest is titanium nitride when $ZrO_2$ is used as the dielectric material. The titanium nitride is typically formed using PVD, PECVD, CVD, or ALD. The capacitor stack may receive a PMA treatment as discussed previously.

Figure 3:
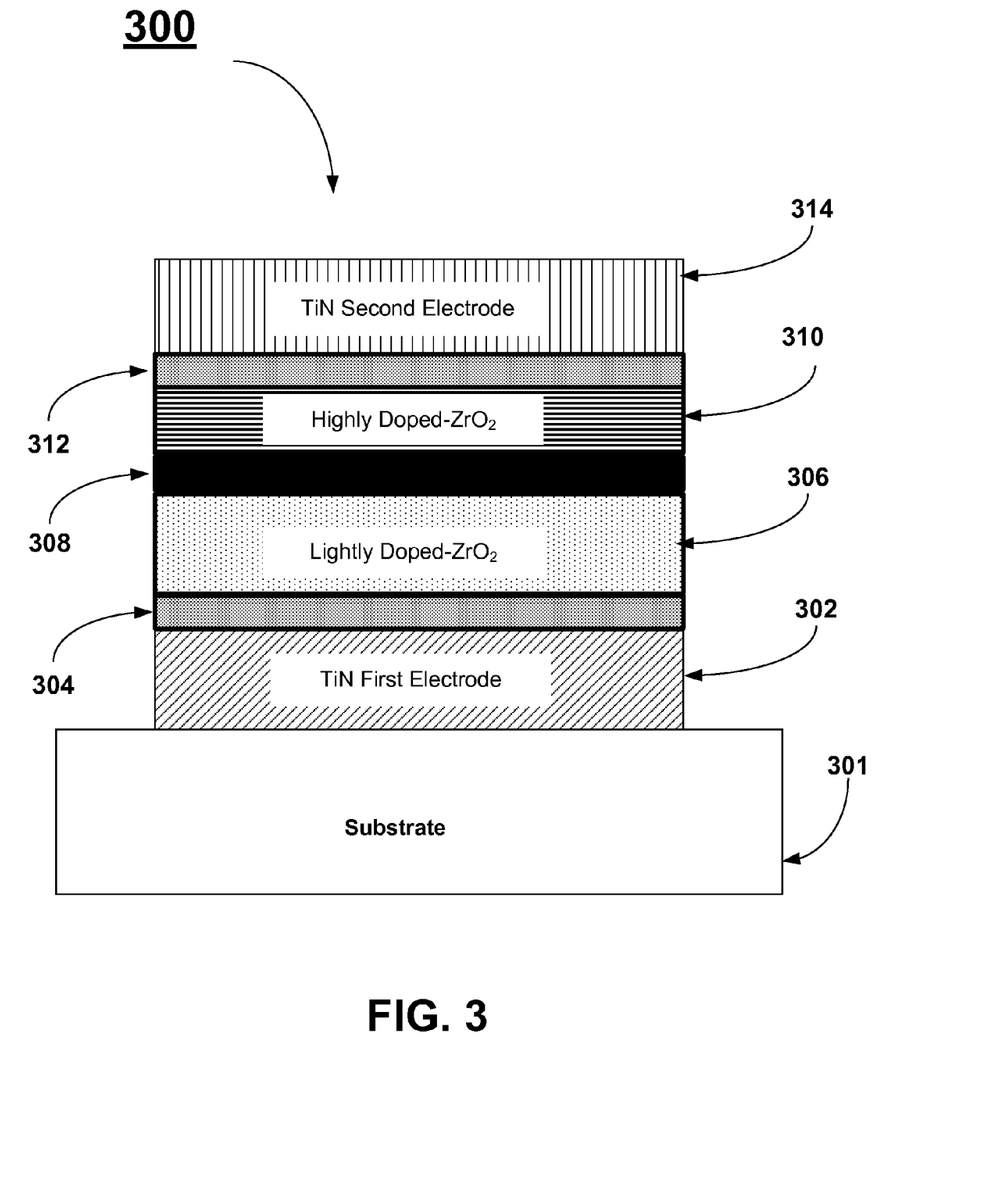
FIG. 3 illustrates a simplified cross-sectional view of a DRAM capacitor stack fabricated in accordance with some embodiments of the present invention.

FIG. 3 illustrates a simplified cross-sectional view of a DRAM capacitor stack fabricated in accordance with some embodiments of the present invention. This example will use $ZrO_2$ as the dielectric material. However, those skilled in the art will understand that the present methods may be applied to many dielectric materials. Examples of suitable dielectric materials comprise $Al_2O_3$, $BaSrTiO_x$ (BST), $HfO_2$, $HfSiO_x$, $Nb_2O_5$, $PbZrTiO_x$ (PZT), $SiO_2$, a bilayer of $SiO_2$ and $Si_xN_y$, SiON, $SrTiO_3$ (STO), $Ta_2O_5$, $TiO_2$, etc.

First electrode layer, 302, is formed above substrate, 301. Generally, the substrate has already received several processing steps in the manufacture of a full DRAM device. First electrode layer, 302, comprises one of metals, metal alloys, conductive metal oxides, conductive metal nitrides, conductive metal silicides, conductive metal carbides, etc. For this example, first electrode layer, 302, comprises a conductive metal nitride. Examples of such conductive metal nitrides include the conductive compounds of cobalt nitride, molybdenum nitride, nickel nitride, tantalum nitride, titanium nitride, titanium aluminum nitride, tungsten nitride, or combinations thereof. A specific electrode material of interest is titanium nitride when $ZrO_2$ is used as the dielectric material. The titanium nitride is typically formed using PVD, PECVD, CVD, or ALD. The TiN first electrode layer may optionally receive an RTA anneal treatment before the formation of the multi-layer dielectric material as discussed previously.

A first electrode interface layer, 304, is formed above first electrode layer, 302. The first electrode interface layer is typically a high k dielectric material and serves several purposes. Advantageously, the first electrode interface layer is formed using the same metal species as the first electrode layer. As an example, when TiN is used as the first electrode layer, $TiO_2$ is often used as the first electrode interface layer. The first electrode interface layer helps to increase the effective k value of the dielectric stack and also helps to protect the first electrode layer from excessive oxidation during the deposition of the dielectric stack. This layer will remain amorphous during a subsequent anneal treatment because it is thin and will help to lower the EOT value of the multi-layer dielectric stack. The first electrode interface layer has a thickness that is typically less than about 10 A, advantageously between about 2 A and about 8 A, and advantageously about 6 A. The first electrode interface layer is typically formed using ALD, PE-ALD, PECVD, or CVD.

Lightly or non-doped $ZrO_2$ first dielectric material, 306, is then formed above the first electrode interface layer. Suitable dopants for use with $ZrO_2$ dielectric materials comprise Al, Co, Er, Ga, Gd, Ge, Hf, La, Mg, Si, Sn, Sr, Ti, Y, or combinations thereof. The doping level is maintained at levels below about 15 atomic % and advantageously below about 10 atomic % so that the layer will crystallize during a subsequent anneal step. This layer will crystallize during a subsequent anneal treatment and will contribute a high k value to the multi-layer dielectric stack. The lightly or non-doped $ZrO_2$ first dielectric material is typically formed using ALD, PE-ALD, PECVD, or CVD.

High band gap second dielectric material, 308, is then formed above the lightly doped $ZrO_2$ material. Suitable high band gap second dielectric materials comprise at least one of $Al_2O_3$, $Er_2O_3$, $Gd_2O_3$, $La_2O_3$, or combinations thereof. This layer will remain amorphous during a subsequent anneal treatment because it is thin and will contribute a high barrier to block conduction through the multi-layer dielectric stack. The high band gap second dielectric material is typically formed using ALD, PE-ALD, PECVD, or CVD.

Highly doped $ZrO_2$ third dielectric material, 310, is then formed above the high band gap second dielectric material to form a multi-layer dielectric stack. Suitable dopants for use with $ZrO_2$ dielectric materials comprise Al, Co, Er, Ga, Gd, Ge, Hf, La, Mg, Si, Sn, Sr, Ti, Y, or combinations thereof. The doping level is maintained at levels above about 15 atomic % and advantageously above about 20 atomic % so that the layer will not crystallize during a subsequent anneal step. This layer will contribute a high barrier to block conduction through the multi-layer dielectric stack. The multi-layer dielectric stack may optionally receive a PDA treatment as discussed previously. The highly doped $ZrO_2$ third dielectric material is typically formed using ALD, PE-ALD, PECVD, or CVD.

In this exemplary capacitor stack, the lightly or non-doped dielectric material has been described as being formed above the first electrode layer, the high band gap material has been described as being formed above the lightly or non-doped dielectric material, and the highly doped material has been described as being formed above the high band gap material. Those skilled in the art will understand that the sequence may be altered and still achieve the benefits of the present invention. That is, the sequence may be that the highly doped dielectric material is formed above the first electrode layer, the high band gap material is formed above the highly doped dielectric material, and the lightly or non-doped material is formed above the high band gap material. Both sequences fall within the scope of the present invention.

In this exemplary capacitor stack, the lightly or non-doped dielectric material has been described as being the same material as the highly doped material. Those skilled in the art will understand that the two layers may comprise different materials and still achieve the benefits of the present invention. One of the layers (i.e. the lightly or non-doped dielectric material) primarily contributes to the high k value of the dielectric stack. The other layer (i.e. the highly doped material) primarily contributes to the low leakage of the dielectric stack. Therefore, each layer may be chosen to maximize its contribution to the benefits of the present invention.

Those skilled in the art will understand that the dopant species used in the highly doped material may be the same or may be different from the dopant species used in the lightly or non-doped dielectric material. One of the layers (i.e. the lightly or non-doped dielectric material) primarily contributes to the high k value of the dielectric stack. The other layer (i.e. the highly doped material) primarily contributes to the low leakage of the dielectric stack. Various dopants may contribute to the k value and the leakage current blocking properties of the dielectric materials in different ways. Therefore, the dopant used in each layer may be chosen to maximize its contribution to the benefits of the present invention.

A second electrode interface layer, 312, is formed above highly doped $ZrO_2$ third dielectric material, 310 to form a multi-layer dielectric stack. The second electrode interface layer is typically a high k dielectric material and serves several purposes. Advantageously, the second electrode interface layer is formed using the same metal species as the second electrode layer. As an example, when TiN is used as the second electrode layer, $TiO_2$ is often used as the second electrode interface layer. This layer will remain amorphous during a subsequent anneal treatment because it is thin and will help to lower the EOT value of the multi-layer dielectric stack. The second electrode interface layer has a thickness that is typically less than about 10 A, advantageously between about 2 A and about 8 A, and advantageously about 6 A. The multi-layer dielectric stack may optionally receive a PDA treatment as discussed previously. The first electrode interface layer is typically formed using ALD, PE-ALD, PECVD, or CVD.

Second electrode layer, 314, is then formed above the multi-layer dielectric stack to form a capacitor stack. Second electrode layer, 314, comprises one of metals, metal alloys, conductive metal oxides, conductive metal nitrides, conductive metal silicides, conductive metal carbides, etc. For this example, second electrode layer, 314, comprises a conductive metal nitride. Examples of such conductive metal nitrides include the conductive compounds of cobalt nitride, molybdenum nitride, nickel nitride, tantalum nitride, titanium nitride, titanium aluminum nitride, tungsten nitride, or combinations thereof. A specific electrode material of interest is titanium nitride when $ZrO_2$ is used as the dielectric material. The capacitor stack may receive a PMA treatment as discussed previously.

Figure 4:
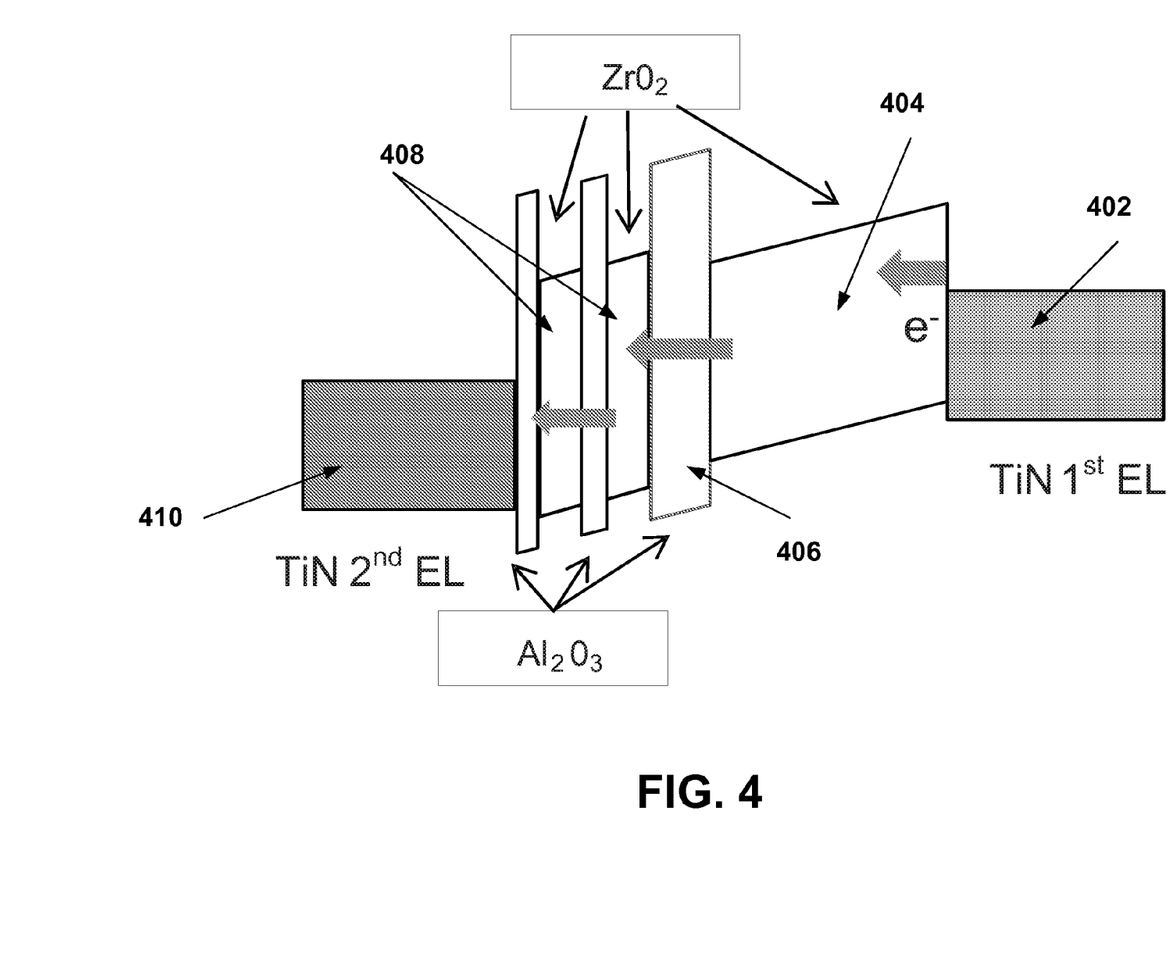
FIG. 4 illustrates a simplified band diagram of a DRAM capacitor stack accordance with some embodiments of the present invention.

FIG. 4 illustrates a simplified band diagram of a DRAM capacitor stack accordance with some embodiments of the present invention. The figure is similar to the capacitor stack illustrated in FIG. 2. Those skilled in the art will understand that a similar band diagram could be illustrated for the capacitor stack illustrated in FIG. 3. This example will use $ZrO_2$ as the dielectric material. However, those skilled in the art will understand that the present methods may be applied to many dielectric materials. Examples of suitable dielectric materials comprise $Al_2O_3$, $BaSrTiO_x$ (BST), $HfO_2$, $HfSiO_x$, $Nb_2O_5$, $PbZrTiO_x$ (PZT), $SiO_2$, a bilayer of $SiO_2$ and $Si_xN_y$, SiON, $SrTiO_3$ (STO), $Ta_2O_5$, $TiO_2$, etc. When $ZrO_2$ is used as the dielectric material, the first electrode is advantageously TiN. The TiN first electrode may optionally receive an RTA anneal treatment before the formation of the multi-layer dielectric material as discussed previously. Lightly or non-doped $ZrO_2$ first dielectric material, 404, is then formed above the TiN first electrode. Suitable dopants for use with $ZrO_2$ dielectric materials comprise Al, Co, Er, Ga, Gd, Ge, Hf, La, Mg, Si, Sn, Sr, Ti, Y, or combinations thereof. The doping level is maintained at levels below about 15 atomic % and advantageously below about 10 atomic % so that the layer will crystallize during a subsequent anneal step. This layer will crystallize during a subsequent anneal treatment and will contribute a high k value to the multi-layer dielectric stack. As illustrated in the band diagram, it is assumed that first electrode layer, 402, is biased negative relative to second electrode layer, 410.

High band gap second dielectric material, 406, is then formed above the lightly doped $ZrO_2$ material. Suitable high band gap second dielectric materials comprise at least one of $Al_2O_3$, $Er_2O_3$, $Gd_2O_3$, $La_2O_3$, or combinations thereof. In this example, the high band gap second dielectric material is $Al_2O_3$. The high band gap of the $Al_2O_3$ (8.8 eV) versus the lower band gap of $ZrO_2$ (5.8) introduces a large energy barrier that the electrons must overcome in order to reach the second electrode layer. This layer will remain amorphous during a subsequent anneal treatment because it is thin.

Highly doped $ZrO_2$ third dielectric material, 408, is then formed above the high band gap second dielectric material to form a multi-layer dielectric stack. Suitable dopants for use with $ZrO_2$ dielectric materials comprise Al, Co, Er, Ga, Gd, Ge, Hf, La, Mg, Si, Sn, Sr, Ti, Y, or combinations thereof. In this example, the dopant is $Al_2O_3$. The high band gap of the $Al_2O_3$ (8.8 eV) versus the lower band gap of $ZrO_2$ (5.8) introduces additional large energy barriers that the electrons must overcome in order to reach the second electrode layer. The additional energy barriers are illustrates as separate layers, but those skilled in the art will understand that the $Al_2O_3$ is likely uniformly distributed throughout the layer. The doping level is maintained at levels above about 15 atomic % and advantageously above about 20 atomic % so that the layer will not crystallize during a subsequent anneal step. The multi-layer dielectric stack may optionally receive a PDA treatment as discussed previously.

In this exemplary capacitor stack, the lightly or non-doped dielectric material has been described as being formed above the first electrode layer, the high band gap material has been described as being formed above the lightly or non-doped dielectric material, and the highly doped material has been described as being formed above the high band gap material. Those skilled in the art will understand that the sequence may be altered and still achieve the benefits of the present invention. That is, the sequence may be that the highly doped dielectric material is formed above the first electrode layer, the high band gap material is formed above the highly doped dielectric material, and the lightly or non-doped material is formed above the high band gap material. Both sequences fall within the scope of the present invention.

In this exemplary capacitor stack, the lightly or non-doped dielectric material has been described as being the same material as the highly doped material. Those skilled in the art will understand that the two layers may comprise different materials and still achieve the benefits of the present invention. One of the layers (i.e. the lightly or non-doped dielectric material) primarily contributes to the high k value of the dielectric stack. The other layer (i.e. the highly doped material) primarily contributes to the low leakage of the dielectric stack. Therefore, each layer may be chosen to maximize its contribution to the benefits of the present invention.

Those skilled in the art will understand that the dopant species used in the highly doped material may be the same or may be different from the dopant species used in the lightly or non-doped dielectric material. One of the layers (i.e. the lightly or non-doped dielectric material) primarily contributes to the high k value of the dielectric stack. The other layer (i.e. the highly doped material) primarily contributes to the low leakage of the dielectric stack. Various dopants may contribute to the k value and the leakage current blocking properties of the dielectric materials in different ways. Therefore, the dopant used in each layer may be chosen to maximize its contribution to the benefits of the present invention.

Second electrode layer, 410, is then formed above the multi-layer dielectric material to form a capacitor stack. When $ZrO_2$ is used as the dielectric material, the second electrode layer is advantageously TiN. The capacitor stack may optionally receive a PMA treatment as discussed previously.

Figure 5:
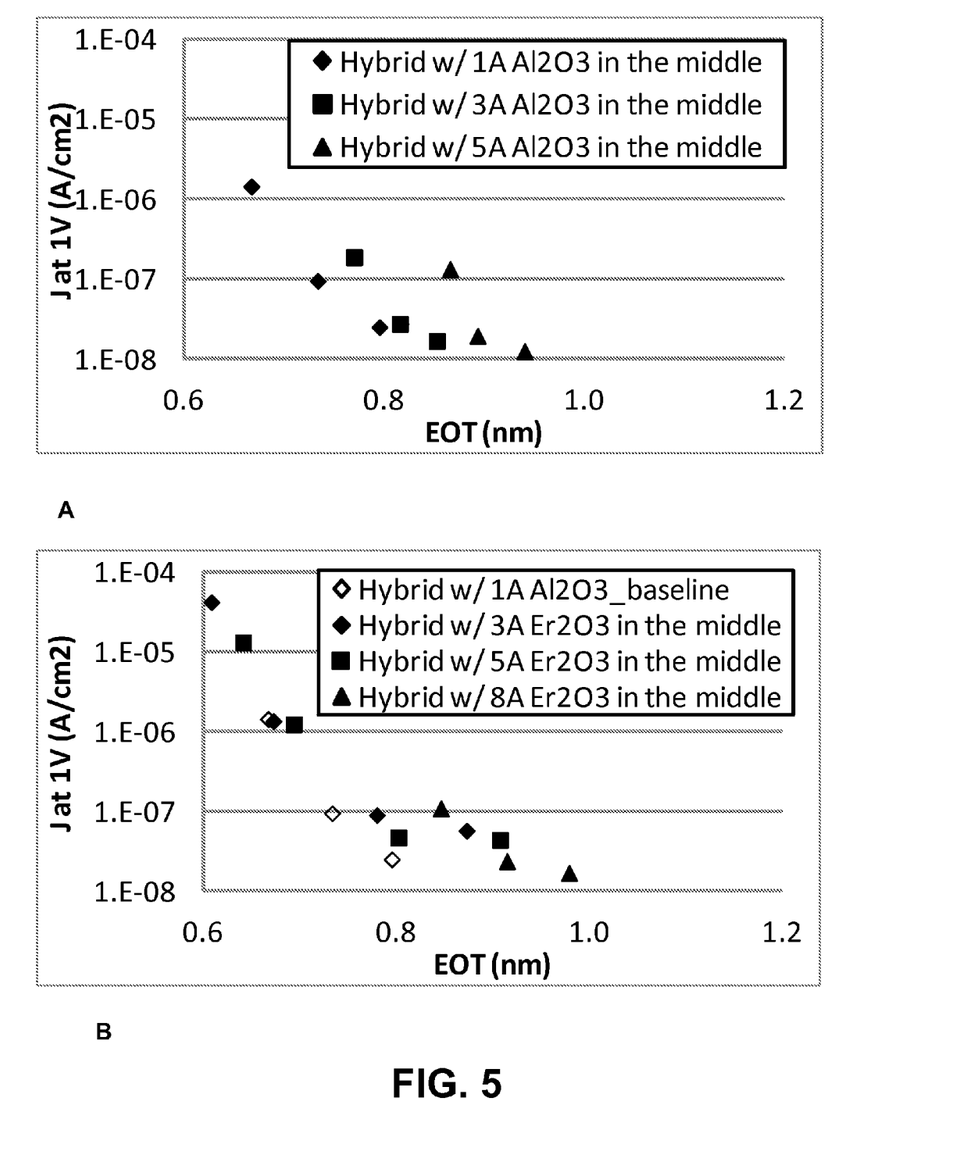
FIG. 5 presents data for leakage current versus EOT for a capacitor stack fabricated in accordance with some embodiments of the present invention.

FIG. 5 presents data for leakage current versus EOT for a capacitor stack fabricated in accordance with some embodiments of the present invention. As described previously, the first electrode layer was titanium nitride formed using PVD. A non-doped first dielectric layer of $ZrO_2$ was formed over the titanium nitride first electrode layer using ALD. The thickness of the non-doped first dielectric layer of $ZrO_2$ was varied between about 40 A and 50 A to provide samples with a range of EOT values. A high band gap second dielectric layer was formed over the non-doped first dielectric layer of $ZrO_2$ layer using ALD. Two different materials were investigated, namely, $Al_2O_3$ and $Er_2O_3$. The data for leakage current ($A/cm^2$) at 1V versus EOT for the $Al_2O_3$ material are presented in chart A. The data for leakage current ($A/cm^2$) at 1V versus EOT for the $Er_2O_3$ material are presented in chart B. Chart B also has a single series of data for 1 A of $Al_2O_3$ for comparison purposes. The thickness of the high band gap second dielectric layer was varied between about 1 A and 5 A to provide samples with a range of EOT values. A highly doped third dielectric layer of $ZrO_2$ was formed over the high band gap second dielectric layer using ALD. The dopant was $Al_2O_3$ and was held at a nominal doping level of about 20 atomic %. The thickness of the highly doped third dielectric layer was held at about 15 A. A titanium nitride second electrode layer was formed above the highly doped third dielectric layer using PVD. The capacitor stack was subjected to a PMA anneal treatment at about 550 C for about 10 minutes in a nitrogen atmosphere. As illustrated in FIG. 5, the samples that incorporated $Al_2O_3$ as the high band gap second dielectric layer exhibited lower leakage current value for similar values of EOT due to the higher band gap value of $Al_2O_3$ as compared to $Er_2O_3$.

Figure 6:
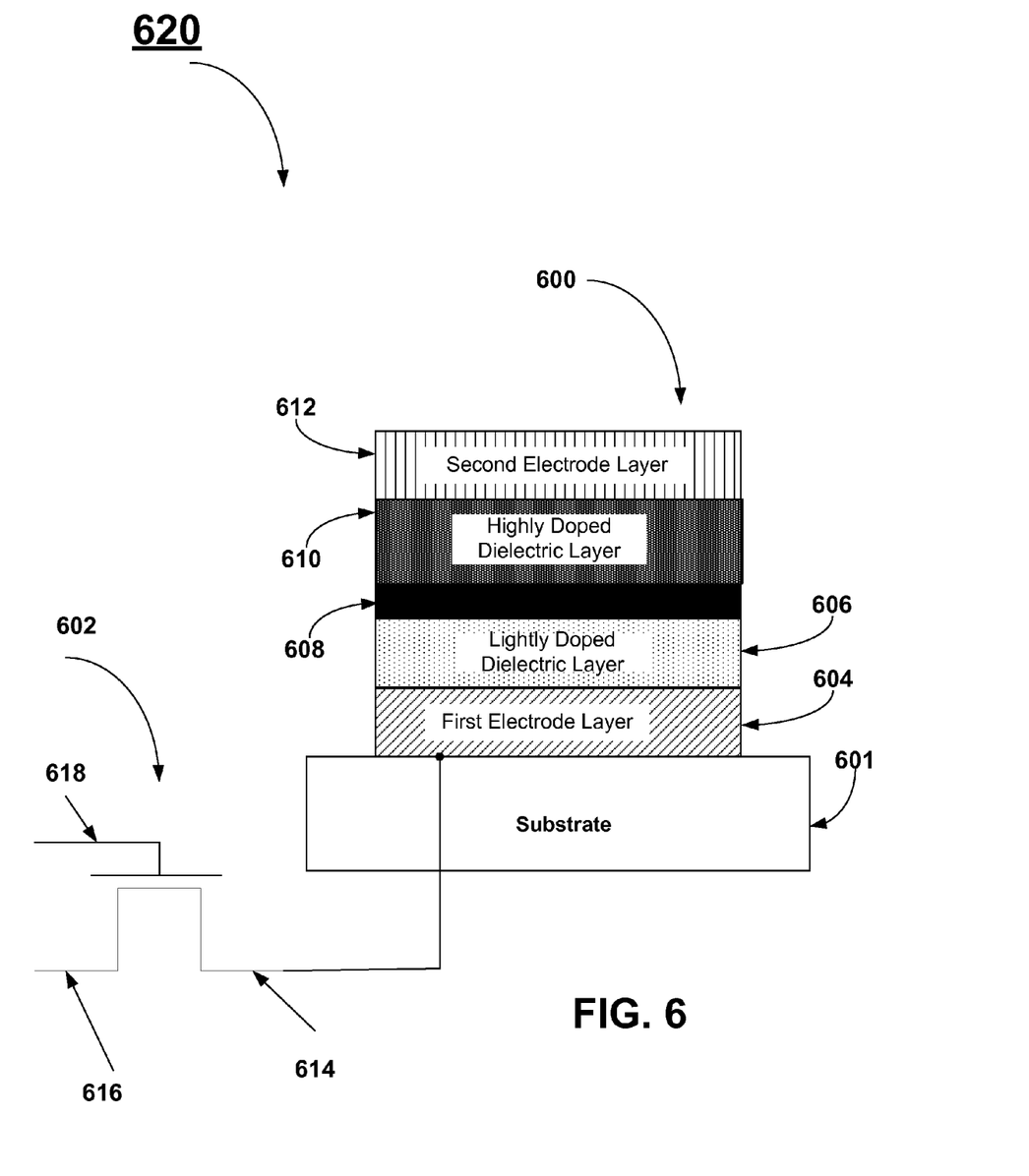
FIG. 6 illustrates a simplified cross-sectional view of a DRAM memory cell fabricated in accordance with some embodiments of the present invention.

An example of a specific application of some embodiments of the present invention is in the fabrication of capacitors used in the memory cells in DRAM devices. DRAM memory cells effectively use a capacitor to store charge for a period of time, with the charge being electronically "read" to determine whether a logical "one" or "zero" has been stored in the associated cell. Conventionally, a cell transistor is used to access the cell. The cell transistor is turned "on" in order to store data on each associated capacitor and is otherwise turned "off" to isolate the capacitor and preserve its charge. More complex DRAM cell structures exist, but this basic DRAM structure will be used for illustrating the application of this disclosure to capacitor manufacturing and to DRAM manufacturing. FIG. 6 is used to illustrate one DRAM cell, 620, manufactured using a structure as discussed previously in reference to FIG. 2. The cell, 620, is illustrated schematically to include two principle components, a cell capacitor, 600, and a cell transistor, 602. The cell transistor is usually constituted by a MOS transistor having a gate, 618, source, 614, and drain, 616. The gate is usually connected to a word line and one of the source or drain is connected to a bit line. The cell capacitor has a lower or storage electrode and an upper or plate electrode. The storage electrode is connected to the other of the source or drain and the plate electrode is connected to a reference potential conductor. The cell transistor is, when selected, turned "on" by an active level of the word line to read or write data from or into the cell capacitor via the bit line.

FIG. 6 illustrates a simplified cross-sectional view of a DRAM capacitor stack fabricated in accordance with some embodiments of the present invention. This example will use $ZrO_2$ as the dielectric material. However, those skilled in the art will understand that the present methods may be applied to many dielectric materials. Examples of suitable dielectric materials comprise $Al_2O_3$, $BaSrTiO_x$ (BST), $HfO_2$, $HfSiO_x$, $Nb_2O_5$, $PbZrTiO_x$ (PZT), $SiO_2$, a bilayer of $SiO_2$ and $Si_xN_y$, SiON, $SrTiO_3$ (STO), $Ta_2O_5$, $TiO_2$, etc.

As was described previously, the cell capacitor, 600, comprises a first electrode layer, 604, formed above substrate, 601. The first electrode layer, 604, is connected to the source or drain of the cell transistor, 602. For illustrative purposes, the first electrode has been connected to the source, 614, in this example. First electrode layer, 604, is formed above substrate, 601. Generally, the substrate has already received several processing steps in the manufacture of a full DRAM device. First electrode layer, 604, comprises one of metals, metal alloys, conductive metal oxides, conductive metal nitrides, conductive metal silicides, conductive metal carbides, etc. For this example, first electrode layer, 604, comprises a conductive metal nitride. Examples of such conductive metal nitrides include the conductive compounds of cobalt nitride, molybdenum nitride, nickel nitride, tantalum nitride, titanium nitride, titanium aluminum nitride, tungsten nitride, or combinations thereof. A specific electrode material of interest is titanium nitride when $ZrO_2$ is used as the dielectric material. The titanium nitride is typically formed using PVD, PECVD, CVD, or ALD. The TiN first electrode layer may optionally receive an RTA anneal treatment before the formation of the multi-layer dielectric material as discussed previously.

Lightly or non-doped $ZrO_2$ first dielectric material, 606, is then formed above the TiN first electrode layer. Suitable dopants for use with $ZrO_2$ dielectric materials comprise Al, Co, Er, Ga, Gd, Ge, Hf, La, Mg, Si, Sn, Sr, Ti, Y, or combinations thereof. The doping level is maintained at levels below about 15 atomic % and advantageously below about 10 atomic % so that the layer will crystallize during a subsequent anneal step. This layer will crystallize during a subsequent anneal treatment and will contribute a high k value to the multi-layer dielectric stack. The lightly or non-doped $ZrO_2$ first dielectric material is typically formed using ALD, PE-ALD, PECVD, or CVD.

High band gap second dielectric material, 608, is then formed above the lightly doped $ZrO_2$ material. Suitable high band gap second dielectric materials comprise at least one of $Al_2O_3$, $Er_2O_3$, $Gd_2O_3$, $La_2O_3$, or combinations thereof. This layer will remain amorphous during a subsequent anneal treatment because it is thin and will contribute a high barrier to block conduction through the multi-layer dielectric stack. The high band gap second dielectric material is typically formed using ALD, PE-ALD, PECVD, or CVD.

Highly doped $ZrO_2$ third dielectric material, 610, is then formed above the high band gap second dielectric material to form a multi-layer dielectric stack. Suitable dopants for use with $ZrO_2$ dielectric materials comprise Al, Co, Er, Ga, Gd, Ge, Hf, La, Mg, Si, Sn, Sr, Ti, Y, or combinations thereof. The doping level is maintained at levels above about 15 atomic % and advantageously above about 20 atomic % so that the layer will not crystallize during a subsequent anneal step. This layer will contribute a high barrier to block conduction through the multi-layer dielectric stack. The multi-layer dielectric stack may optionally receive a PDA treatment as discussed previously. The highly doped $ZrO_2$ third dielectric material is typically formed using ALD, PE-ALD, PECVD, or CVD.

In this exemplary capacitor stack, the lightly or non-doped dielectric material has been described as being formed above the first electrode layer, the high band gap material has been described as being formed above the lightly or non-doped dielectric material, and the highly doped material has been described as being formed above the high band gap material. Those skilled in the art will understand that the sequence may be altered and still achieve the benefits of the present invention. That is, the sequence may be that the highly doped dielectric material is formed above the first electrode layer, the high band gap material is formed above the highly doped dielectric material, and the lightly or non-doped material is formed above the high band gap material. Both sequences fall within the scope of the present invention.

In this exemplary capacitor stack, the lightly or non-doped dielectric material has been described as being the same material as the highly doped material. Those skilled in the art will understand that the two layers may comprise different materials and still achieve the benefits of the present invention. One of the layers (i.e. the lightly or non-doped dielectric material) primarily contributes to the high k value of the dielectric stack. The other layer (i.e. the highly doped material) primarily contributes to the low leakage of the dielectric stack. Therefore, each layer may be chosen to maximize its contribution to the benefits of the present invention.

Those skilled in the art will understand that the dopant species used in the highly doped material may be the same or may be different from the dopant species used in the lightly or non-doped dielectric material. One of the layers (i.e. the lightly or non-doped dielectric material) primarily contributes to the high k value of the dielectric stack. The other layer (i.e. the highly doped material) primarily contributes to the low leakage of the dielectric stack. Various dopants may contribute to the k value and the leakage current blocking properties of the dielectric materials in different ways. Therefore, the dopant used in each layer may be chosen to maximize its contribution to the benefits of the present invention.

Second electrode layer, 612, is then formed above the multi-layer dielectric stack to form a capacitor stack. Second electrode layer, 612, comprises one of metals, metal alloys, conductive metal oxides, conductive metal nitrides, conductive metal silicides, conductive metal carbides, etc. For this example, second electrode layer, 612, comprises a conductive metal nitride. Examples of such conductive metal nitrides include the conductive compounds of cobalt nitride, molybdenum nitride, nickel nitride, tantalum nitride, titanium nitride, titanium aluminum nitride, tungsten nitride, or combinations thereof. A specific electrode material of interest is titanium nitride when $ZrO_2$ is used as the dielectric material. The titanium nitride is typically formed using PVD, PECVD, CVD, or ALD. The capacitor stack may receive a PMA treatment as discussed previously.

Figure 7:
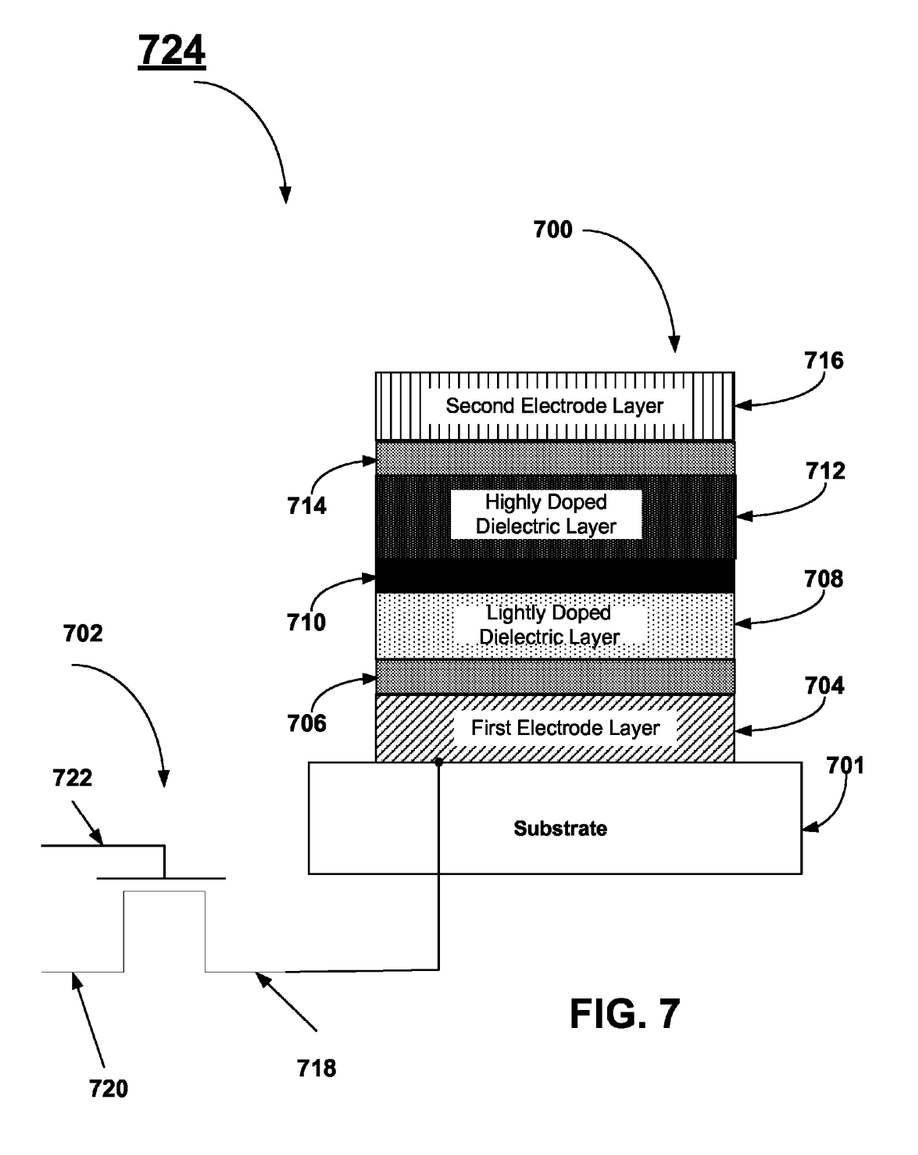
FIG. 7 illustrates a simplified cross-sectional view of a DRAM memory cell fabricated in accordance with some embodiments of the present invention.

Another example of a specific application of some embodiments of the present invention is in the fabrication of capacitors used in the memory cells in DRAM devices. FIG. 7 is used to illustrate one DRAM cell, 724, manufactured using a structure as discussed previously in reference to FIG. 3. The cell, 724, is illustrated schematically to include two principle components, a cell capacitor, 700, and a cell transistor, 702. The cell transistor is usually constituted by a MOS transistor having a gate, 722, source, 718, and drain, 720. The gate is usually connected to a word line and one of the source or drain is connected to a bit line. The cell capacitor has a lower or storage electrode and an upper or plate electrode. The storage electrode is connected to the other of the source or drain and the plate electrode is connected to a reference potential conductor. The cell transistor is, when selected, turned "on" by an active level of the word line to read or write data from or into the cell capacitor via the bit line.

FIG. 7 illustrates a simplified cross-sectional view of a DRAM capacitor stack fabricated in accordance with some embodiments of the present invention. This example will use $ZrO_2$ as the dielectric material. However, those skilled in the art will understand that the present methods may be applied to many dielectric materials. Examples of suitable dielectric materials comprise $Al_2O_3$, $BaSrTiO_x$ (BST), $HfO_2$, $HfSiO_x$, $Nb_2O_5$, $PbZrTiO_x$ (PZT), $SiO_2$, a bilayer of $SiO_2$ and $Si_xN_y$, SiON, $SrTiO_3$ (STO), $Ta_2O_5$, $TiO_2$, etc.

As was described previously, the cell capacitor, 700, comprises a first electrode layer, 704, formed above substrate, 701. The first electrode layer, 704, is connected to the source or drain of the cell transistor, 702. For illustrative purposes, the first electrode has been connected to the source, 718, in this example. First electrode layer, 704, is formed above substrate, 701. Generally, the substrate has already received several processing steps in the manufacture of a full DRAM device. First electrode layer, 704, comprises one of metals, metal alloys, conductive metal oxides, conductive metal nitrides, conductive metal silicides, conductive metal carbides, etc. For this example, first electrode layer, 704, comprises a conductive metal nitride. Examples of such conductive metal nitrides include the conductive compounds of cobalt nitride, molybdenum nitride, nickel nitride, tantalum nitride, titanium nitride, titanium aluminum nitride, tungsten nitride, or combinations thereof. A specific electrode material of interest is titanium nitride when $ZrO_2$ is used as the dielectric material. The titanium nitride is typically formed using PVD, PECVD, CVD, or ALD. The TiN first electrode layer may optionally receive an RTA anneal treatment before the formation of the multi-layer dielectric material as discussed previously.

A first electrode interface layer, 706, is formed above first electrode layer, 704. The first electrode interface layer is typically a high k dielectric material and serves several purposes. Advantageously, the first electrode interface layer is formed using the same metal species as the first electrode layer. As an example, when TiN is used as the first electrode layer, $TiO_2$ is often used as the first electrode interface layer. The first electrode interface layer helps to increase the effective k value of the dielectric stack and also helps to protect the first electrode layer from excessive oxidation during the deposition of the dielectric stack. This layer will remain amorphous during a subsequent anneal treatment because it is thin and will help to lower the EOT value of the multi-layer dielectric stack. The first electrode interface layer has a thickness that is typically less than about 10 A, advantageously between about 2 A and about 8 A, and advantageously about 6 A. The first electrode interface layer is typically formed using ALD, PE-ALD, PECVD, or CVD.

Lightly or non-doped $ZrO_2$ first dielectric material, 708, is then formed above the first electrode interface layer. Suitable dopants for use with $ZrO_2$ dielectric materials comprise Al, Co, Er, Ga, Gd, Ge, Hf, La, Mg, Si, Sn, Sr, Ti, Y, or combinations thereof. The doping level is maintained at levels below about 15 atomic % and advantageously below about 10 atomic % so that the layer will crystallize during a subsequent anneal step. This layer will crystallize during a subsequent anneal treatment and will contribute a high k value to the multi-layer dielectric stack. The lightly or non-doped $ZrO_2$ first dielectric material is typically formed using ALD, PE-ALD, PECVD, or CVD.

High band gap second dielectric material, 710, is then formed above the lightly doped $ZrO_2$ material. Suitable high band gap second dielectric materials comprise at least one of $Al_2O_3$, $Er_2O_3$, $Gd_2O_3$, $La_2O_3$, or combinations thereof. This layer will remain amorphous during a subsequent anneal treatment because it is thin and will contribute a high barrier to block conduction through the multi-layer dielectric stack. The high band gap second dielectric material is typically formed using ALD, PE-ALD, PECVD, or CVD.

Highly doped $ZrO_2$ third dielectric material, 712, is then formed above the high band gap second dielectric material to form a multi-layer dielectric stack. Suitable dopants for use with $ZrO_2$ dielectric materials comprise Al, Co, Er, Ga, Gd, Ge, Hf, La, Mg, Si, Sn, Sr, Ti, Y, or combinations thereof. The doping level is maintained at levels above about 15 atomic % and advantageously above about 20 atomic % so that the layer will not crystallize during a subsequent anneal step. This layer will contribute a high barrier to block conduction through the multi-layer dielectric stack. The multi-layer dielectric stack may optionally receive a PDA treatment as discussed previously. The highly doped $ZrO_2$ third dielectric material is typically formed using ALD, PE-ALD, PECVD, or CVD.

In this exemplary capacitor stack, the lightly or non-doped dielectric material has been described as being formed above the first electrode layer, the high band gap material has been described as being formed above the lightly or non-doped dielectric material, and the highly doped material has been described as being formed above the high band gap material. Those skilled in the art will understand that the sequence may be altered and still achieve the benefits of the present invention. That is, the sequence may be that the highly doped dielectric material is formed above the first electrode layer, the high band gap material is formed above the highly doped dielectric material, and the lightly or non-doped material is formed above the high band gap material. Both sequences fall within the scope of the present invention.

In this exemplary capacitor stack, the lightly or non-doped dielectric material has been described as being the same material as the highly doped material. Those skilled in the art will understand that the two layers may comprise different materials and still achieve the benefits of the present invention. One of the layers (i.e. the lightly or non-doped dielectric material) primarily contributes to the high k value of the dielectric stack. The other layer (i.e. the highly doped material) primarily contributes to the low leakage of the dielectric stack. Therefore, each layer may be chosen to maximize its contribution to the benefits of the present invention.

Those skilled in the art will understand that the dopant species used in the highly doped material may be the same or may be different from the dopant species used in the lightly or non-doped dielectric material. One of the layers (i.e. the lightly or non-doped dielectric material) primarily contributes to the high k value of the dielectric stack. The other layer (i.e. the highly doped material) primarily contributes to the low leakage of the dielectric stack. Various dopants may contribute to the k value and the leakage current blocking properties of the dielectric materials in different ways. Therefore, the dopant used in each layer may be chosen to maximize its contribution to the benefits of the present invention.

A second electrode interface layer, 714, is formed above highly doped $ZrO_2$ third dielectric material, 712 to form a multi-layer dielectric stack. The second electrode interface layer is typically a high k dielectric material and serves several purposes. Advantageously, the second electrode interface layer is formed using the same metal species as the second electrode layer. As an example, when TiN is used as the second electrode layer, $TiO_2$ is often used as the second electrode interface layer. This layer will remain amorphous during a subsequent anneal treatment because it is thin and will help to lower the EOT value of the multi-layer dielectric stack. The second electrode interface layer has a thickness that is typically less than about 10 A, advantageously between about 2 A and about 8 A, and advantageously about 6 A. The multi-layer dielectric stack may optionally receive a PDA treatment as discussed previously. The first electrode interface layer is typically formed using ALD, PE-ALD, PECVD, or CVD.

Second electrode layer, 716, is then formed above the multi-layer dielectric stack to form a capacitor stack. Second electrode layer, 716, comprises one of metals, metal alloys, conductive metal oxides, conductive metal nitrides, conductive metal silicides, conductive metal carbides, etc. For this example, second electrode layer, 716, comprises a conductive metal nitride. Examples of such conductive metal nitrides include the conductive compounds of cobalt nitride, molybdenum nitride, nickel nitride, tantalum nitride, titanium nitride, titanium aluminum nitride, tungsten nitride, or combinations thereof. A specific electrode material of interest is titanium nitride when $ZrO_2$ is used as the dielectric material. The capacitor stack may receive a PMA treatment as discussed previously.

Although the foregoing examples have been described in some detail for purposes of clarity of understanding, the invention is not limited to the details provided. There are many alternative ways of implementing the invention. The disclosed examples are illustrative and not restrictive.

What is claimed:

1. A method for forming a capacitor stack comprising:
    forming a first material on a substrate, wherein the first material is operable as a first electrode of the capacitor stack;
    forming a second material above the first material, wherein the second material is operable as a first dielectric of the capacitor stack, wherein the second material is $ZrO_2$, wherein the second material is lightly doped or non-doped, and wherein the dopant is one of Al, Co, Er, Ga, Gd, Ge, Hf, La, Mg, Si, Sn, Sr, Ti, Y, or combinations thereof;
    forming a third material above the second material, wherein the third material is operable as a second dielectric of the capacitor stack, and wherein the third material has a band gap greater than about 5.8 eV;
    forming a fourth material above the third material, wherein the fourth material is operable as a third dielectric of the capacitor stack, wherein the fourth material is $ZrO_2$, wherein the fourth material is highly doped, wherein the dopant is one of Al, Co, Er, Ga, Gd, Ge, Hf, La, Mg, Si, Sn, Sr, Ti, Y, or combinations thereof, and wherein a concentration of the dopant in the fourth material being greater than a concentration of the dopant in the second material; and
    forming a fifth material above the fourth material, wherein the fifth material is operable as a second electrode of the capacitor stack.

2. The method of claim 1 wherein the second material is doped and the doping level is below about 10 atomic %.

3. The method of claim 1 wherein the fourth material is doped and the doping level is above about 15 atomic %.

4. The method of claim 1 wherein the third material is one of $Al_2O_3$, $Er_2O_3$, $Gd_2O_3$, $La_2O_3$, or combinations thereof.

5. The method of claim 1 further comprising forming a sixth material between the first material and the second material, wherein the sixth material is a fourth dielectric layer of the capacitor stack, and further comprising forming a seventh material between the fourth material and the fifth material, wherein the seventh material is a fifth dielectric layer of the capacitor stack.

6. The method of claim 5 wherein the sixth material and the seventh material are each $TiO_2$.

7. The method of claim 5 wherein the thickness of each of the sixth material and the seventh material is less than about 10 A.

8. A method for forming a capacitor stack comprising:
    forming a first material on a substrate, wherein the first material is operable as a first electrode of the capacitor stack;
    forming a second material above the first material, wherein the second material is operable as a first dielectric of the capacitor stack, wherein the second material is $ZrO_2$, and wherein the second material is highly doped;
    forming a third material above the second material, wherein the third material is operable as a second dielectric of the capacitor stack, and wherein the third material has a band gap greater than about 5.8 eV;
    forming a fourth material above the third material, wherein the fourth material is operable as a third dielectric of the capacitor stack, wherein the fourth material is $ZrO_2$, and wherein the fourth material is lightly doped or non-doped, a concentration of the dopant in the fourth material being less than a concentration of the dopant in the second material; and
    forming a fifth material above the fourth material, wherein the fifth material is operable as a second electrode of the capacitor stack.

9. The method of claim 8 wherein the second material and the fourth material are each doped with a dopant and the dopant is one of Al, Co, Er, Ga, Gd, Ge, Hf, La, Mg, Si, Sn, Sr, Ti, Y, or combinations thereof.

10. The method of claim 8 wherein the third material is one of $Al_2O_3$, $Er_2O_3$, $Gd_2O_3$, $La_2O_3$, or combinations thereof.

11. The method of claim 8 further comprising forming a sixth material between the first material and the second material, wherein the sixth material is a fourth dielectric layer of the capacitor stack, and further comprising forming a seventh material between the fourth material and the fifth material, wherein the seventh material is a fifth dielectric layer of the capacitor stack.

12. The method of claim 9 wherein the second material is doped and the doping level is above about 15 atomic %.

13. The method of claim 9 wherein the fourth material is doped and the doping level is below about 10 atomic %.

14. The method of claim 11 wherein the sixth material and the seventh material are each $TiO_2$.

15. The method of claim 11 wherein the thickness of each of the sixth material and the seventh material is less than about 10 A.

* * * * *